United States Patent [19]
Yamada

[11] Patent Number: 5,170,236
[45] Date of Patent: Dec. 8, 1992

[54] LAYER-BUILT SOLID STATE IMAGE SENSING DEVICE

[75] Inventor: Tetsuo Yamada, Yokohama, Japan

[73] Assignee: Kabushiki Kaishi Toshiba, Kawasaki, Japan

[21] Appl. No.: 877,214

[22] Filed: May 1, 1992

[30] Foreign Application Priority Data

May 1, 1991 [JP] Japan .................. 3-100225

[51] Int. Cl.⁵ .................. H01L 29/78; H01L 27/14; H01L 31/00
[52] U.S. Cl. .................. 257/222; 257/233; 257/293; 257/294
[58] Field of Search .................. 357/24, 30

[56] References Cited

U.S. PATENT DOCUMENTS

| | | | |
|---|---|---|---|
| 4,323,912 | 4/1982 | Koike et al. | 357/24 |
| 4,661,830 | 4/1987 | Ohta et al. | 357/24 |
| 4,851,887 | 7/1989 | Hagiwara | 357/24 |
| 4,912,560 | 3/1990 | Osawa et al. | 357/24 |

*Primary Examiner*—Gene M. Munson
*Attorney, Agent, or Firm*—Foley & Lardner

[57] ABSTRACT

Disclosed is a layer-built solid state image sensing device comprising: a first semiconductor layer of a first conductivity type; a plurality of optoelectro transducing storage elements having a first optoelectro transduction layer of a second conductivity type opposite to the first conductivity type selectively formed within regions isolated pixel column by pixel column by a first isolating layer of the first conductivity type on the first semiconductor layer surface of the first conductivity type; charge transfer elements having a first impurity layer of the second conductivity type formed in columns a regular distance away from optoelectro transducing storage element columns within the isolating areas on the first semiconductor layer surface, and a transfer conductive electrode layer buried within an insulating film selectively formed on the surface other than the first optoelectro transducing layer and a light shielding electrode provided to enclose the transfer electrode also buried within the insulating film, for reading signal charges stored in the optoelectro transducing storage elements; a second optoelectro transducing layer of the second conductivity type formed on the insulating film and connected to the first optoelectro transducing layer; and a second impurity layer of the first conductivity type for covering the surface of the second optoelectro transducing layer.

7 Claims, 3 Drawing Sheets

LAYER-BUILT SOLID STATE IMAGE SENSING DEVICE

BACKGROUND OF THE INVENTION

The present invention relates to a layer-built solid state image sensing device. With the spread of home video cameras, higher resolution and higher sensitivity being increasingly required for solid state image sensing devices. In order to improve the resolution, it is necessary to increase the integration rate of pixels which are units for constituting an image, and this inevitably reduces the dimensions of the pixels. However, the quantity of light incident upon one pixel decreases with decreasing pixel dimensions, and therefore the sensitivity thereof is inevitably reduced. As described above, there exists a contradictory relationship between the higher resolution and the higher sensitivity of the solid state image sensing device.

From the standpoint as described above, since the light receiving area of each pixel is required to be increased to the allowable limit of the occupied area, a layer-built solid state image sensing device where an optoelectro transducing layer and a charge transferring layer are arranged in three dimensional manner has been proposed as one effective way of solving the above-mentioned problem.

FIG. 6 shows a cross-sectional view showing the major parts of the prior art layer-built solid state image sensing device. In this prior art layer-built solid state image sensing device, an n+-type charge storage layer 5 for storing optoelectro transduced charges and an n-type channel impurity layer 6 for transferring the charges are arranged with gaps therebetween on regions separated column by column by an element isolating layer 8 on the surface of a p-type semiconductor substrate 1. The above-mentioned gaps form a surface transfer channel portion 10 which serves as a transfer route for transferring signal charges from the n+-type charge storage layer 5 to the n-type channel impurity layer 6.

Furthermore, a charge transfer electrode 7 is provided over the n-type channel impurity layer 6 and the surface transfer channel portion 10 via an insulating layer 9. The insulating layer 9 further extends over the charge transfer electrode 7. Furthermore, a metallic electrode 4 used in common as a light shading film is provided over the insulating layer 9. The layer-built optoelectro transducing film 2 made of amorphous substance (e.g., amorphous silicon) is formed on the metallic electrode 4. The charge storage layer 5 can be ohmically connected to metal, because of its high impurity concentration. Therefore, the electrode 4 is directly brought into contact with the charge storage layer 5 for electrical connection. Further, a grounded transparent electrode 3 is formed on the surface of the optoelectro transducing film 2 for fixing the surface potential of the optoelectro transducing film 2.

The operation of the prior art layer-built solid state image sensing device as described above will be described hereinbelow. The incidence of light on the optoelectro transducing film 2 produces pairs of electron and hole. The produced electrons are moved and stored in the n-type charge storage layer 5 as a signal, and the produced holes are moved to the transparent electrode 3 and further transferred to the outside therethrough.

FIGS. 7A and 7B show the potential distribution of the n+-type charge storage layer 5, the surface transfer channel portion 10, and the n-type channel impurity layer 6. FIG. 7A shows the charge storage status, in which the potential of the transfer channel 10 is approximately equal to that (shown by 13) of the substrate 1, and the signal charge 11 is kept and stored under the n-type charge storage layer 5 in addition to the charge 12. FIG. 7B represents the status where the stored signal charge 11 is transferred from the n+-type charge storage layer 5 to the n-type channel impurity layer 6. When a high voltage is applied to the transfer electrode 7, since the surface potential of the transfer channel 10 increases up to a potential indicated by 15 and further the transfer channel potential 14 rises, the stored signal charge 11 is transferred to the transfer channel layer 6 beyond the barrier of the potential 15. In this case, however, the charge stored in the charge storage layer 5 is not necessarily transferred perfectly, but a residual charge 12 remains in proportion to the potential 15.

As described above, in the prior art layer-built solid state image sensing device, the residual charge 12 inevitably remains in the n+-type charge storage layer 5, as far as a voltage within a practical range is applied to the transfer electrode 7. Further, since the metallic electrode 4 will not be depleted, in the status as shown in FIG. 7B, a thermal diffusion current due to the residual charge including the charge in the metallic electrode 4 flows beyond the barrier potential, and then is mixed with the signal charge. The above-mentioned phenomenon occurs even in the status where the signal charge is zero, thus causing a problem in that a so-called residual image is inevitably produced.

Furthermore, in the prior art structure, since the barrier potential 15 fluctuates due to thermal and electrical disturbances, the transferred charge also fluctuates, thus causing another problem in that the above-mentioned fluctuations cause noise components in the signal charge and therefore the signal charge is disturbed.

In addition, since a well-known interface level is present in the depletion portion at which the n+-type charge storage layer 5 and the element separating layer 8 are in contact with the insulating layer 9, there exists another problem in that a so-called dark current flows as the noise components of the signal.

SUMMARY OF THE INVENTION

With these problems in mind, therefore, it is the object of the present invention to provide a layer-built solid state image sensing device low in both residual image and noise.

According to the present invention there is provided a layer-built solid state image sensing device, comprising: a first semiconductor layer of a first conductivity type; a plurality of optoelectro transduction storage elements having a first optoelectro transducing layer of a second conductivity type opposite to the first conductivity type selectively formed within region isolated pixel column by pixel column by a first isolating layer of the first conductivity type formed on a first semiconductor layer surface of the first conductivity type; charge transfer elements having a first impurity layer of the second conductivity type formed in columns a regular distance away from optoelectro transduction storage element columns within the isolating areas on the first semiconductor layer surface, a transfer electrode layer buried within an insulating film selectively formed on the surface other than the first optoelectro transducing layer, and a light shielding electrode provided to enclose the transfer electrode also buried within the insulating film, for reading signal charges stored in said optoelectro transducing storage elements; a second optoelectro transducing layer of the second conductivity type formed on the insulating film and connected to the first optoelectro transducing layer; and a second impurity layer of the first conductivity type for covering the surface of said second optoelectro transducing layer.

In the layer-built solid state image sensing device according to the present invention, a second optoelectro transducing layer formed on an insulating layer is an impurity layer of the same conductivity type as a first optoelectro transducing layer formed on the substrate surface; the surface of the second optoelectro transducing layer is covered with an impurity layer of the opposite conductivity type; and the pixels are separated from each other. Further, the potential of the metallic electrode formed within the insulating layer is so determined that carriers opposite in polarity to the signal can be introduced into the interface portion between the second optoelectro transducing layer and the insulating layer. Therefore, it is possible to transfer the signal charges stored in the optoelectro transducing elements in the perfect transfer mode and to thus almost perfectly reduce the generation of dark current and residual image both involved in the prior art layer-built solid state image sensing device. In this case, when the impurity layer is a monocrystal semiconductor material, it is possible to easily form pn junctions or inversion boundary layers excellent in crystallization, and without depleting the surface portions thereof or the interface portions with the insulating films, thus realizing excellent optoelectro transduction and charge storage functions, and therefore a perfect charge transfer.

DETAILED DESCRIPTION OF THE PREFERRED EMBODIMENTS

An embodiment of the present invention will be described hereinbelow with reference to the attached drawings.

Figure 1:
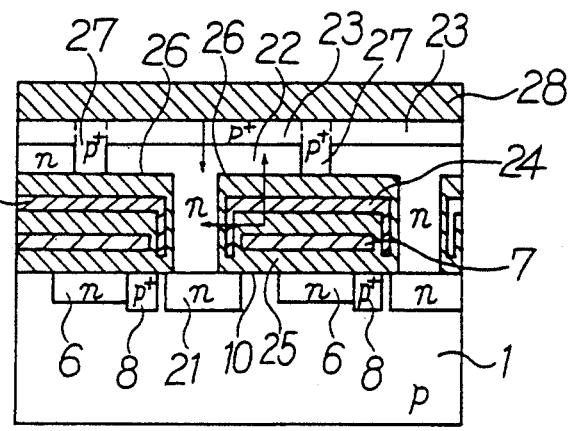
FIG. 1 is a partial cross sectional view showing a first embodiment of the layer-built solid state image sensing device according to the present invention.

FIG. 1 is a cross-sectional view showing the construction of the first embodiment of the present invention. The surface of a p-type semiconductor substrate 1 is divided into a plurality of regions by an element isolation layer 8. Within the isolated region, an n-type charge storage layer 21 for storing optoelectro transduced charge and an n-type channel impurity layer 6 are formed with a gap between the two layers. The gap portion forms a surface transfer channel portion 10 serving as a transfer path through which a signal charge is transferred from the n-type charge storage layer 21 to the n-type channel impurity layer 6.

A charge transfer electrode 7 is buried within an insulating layer 25 formed over the n-type channel impurity layer 6 and the surface transfer channel portion 10. Further, a light shielding film 24 so formed as to enclose both the upper and side portions of the charge transfer electrode 7 is buried similarly within the insulating layer 25. An n-type surface optoelectro transducing layer 22 formed on the insulating layer 25 is connected to the n-type charge storage layer 21. This n-type surface optoelectro transducing layer 22 is formed preferably by growing a monocrystal silicon, for instance. The n-type surface optoelectro transducing layer 22 is isolated pixel by pixel by a $p^+$-type surface isolating layer 27 formed partially on the insulating layer 25. The $p^+$-type surface isolating layer 27 is connected to a high concentration $p^+$-type impurity layer 23 for covering the entire surface of the device, and further the device is covered with a surface protecting film 28.

Figure 2:
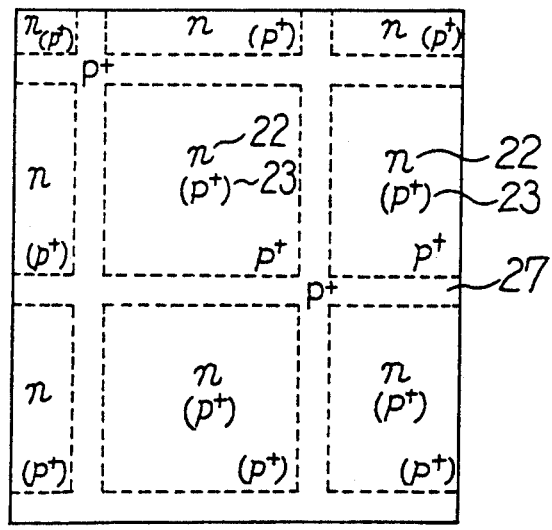
FIG. 2 is a partial constructional plan view showing the first embodiment of the layer-built solid state image sensing device according to the present invention.

FIG. 2 is a plan view showing the arrangement relationship between the n-type surface optoelectro transducing layer 22, the $p^+$-type surface 23, and the $p^+$-type surface isolating layer 27, which indicates that the n-type surface optoelectro transducing layer 22 and the $p^+$-type surface layer 23 are separated by pixel by the $p^+$-type surface isolating layer 27.

The operation of the device thus constructed will be described hereinbelow.

The potential of the p-type surface layer is set to the potential equal to the substrate, and kept at a non-depletion (neutral) status except the pn junction portions. When a high voltage pulse is applied to the electrode 7 in accordance with the well-known interline transfer method, the charge transfer surface channel 10 becomes conductive, so that the signal charge generated at the n-type charge storage layer 21 is transferred from the n-type charge storage layer 21 to the n-type channel impurity layer 6. At this time, it is possible to perfectly transfer the signal charge generated at the n-type charge storage layer 21 by applying a channel potential high enough to completely deplete the n-type charge storage layer 21 to the charge transfer surface channel 10; that is, it is possible to realize a perfect transfer of the signal charge without causing residual image.

Further, as already described, since the n-type surface optoelectro transducing layer 22 is formed by growing a monocrystal silicon, for instance, the impurity concentration can be controlled as required. Therefore, it is possible to completely deplete the n-type charge storage layer 21 by the charge transfer potential of the charge transfer surface channel 10, and simultaneously deplete the n-type surface optoelectro transducing layer 22 by setting the perfect depletion potential of the n-type surface optoelectro transducing layer 22 to a potential lower than or equal to the perfect depletion potential of the n-type charge storage layer 21.

Figure 3:
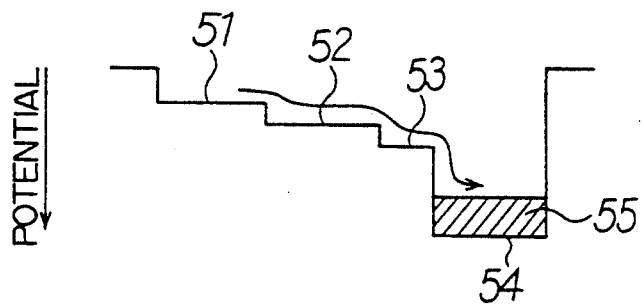
FIG. 3 is a potential distribution diagram for assistance in explaining the operation principle of the layer-built solid state image, sensing device according to the present invention.

FIG. 3 is a potential distribution diagram showing the potential change during the charge transfer operation at the respective portions extending from the n-type surface optoelectro transducing layer 22, through the n-type charge storage layer 21 and the charge transfer surface channel 10, to the n-type channel impurity layer 6, in which 51 indicates the potential of the n-type surface optoelectro transducing layer 22; 52 indicates that of the charge storage layer 21; 53 indicates that of the surface transfer channel 10; and 54 indicates that of the channel of the charge transfer device, respectively. Since the potentials at the respective stages increase with the advance of the charge transfer, the signal charge can be completely transferred, as shown by 55 in FIG. 3. As the result of the complete transfer, there exists no residual charge as in the prior art device, and so it is possible to almost eliminate the residual image. In addition, since the surface of the n-type surface optoelectro transducing layer 22 is covered by a high concentration p+-type layer of non-depletion type, the surface level is kept in the neutral thermally-balanced status and therefore in such a status that the generation of the thermal carriers is well balanced with the recombination thereof. Accordingly, it is possible to reduce the mixing of the thermally generated carriers with the dark current to such an extent as to be negligible.

Figure 4A:
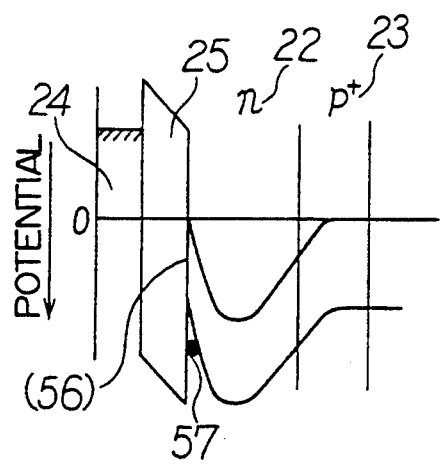
FIGS. 4A and 4B are other potential distribution diagrams for assistance in explaining the operation principle of the layer-built solid state image sensing device according to the present invention.
Figure 4B:
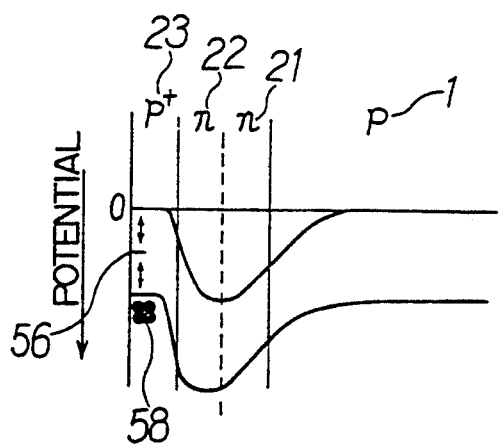

FIG. 4B shows the primary potential distribution in the vertical direction from the p+-type surface layer 23, through the n-type surface optoelectro transducing layer 22 and the n-type charge storage layer 21, to the p-type semiconductor substrate 1. As shown, the surface is filled with holes 58, and the surface level 56 is in the non-active status as the electron generation center. On the other hand, since the interface 26 between the insulating film 25 and the surface optoelectro transducing layer 22 is not covered by the p-type layer, the surface level at this portion is in the active status as the electron generation center. However, it is possible to fill the interface with holes by forming the light shading film 24 with conductive materials such as aluminum or silicide of metal and by applying a negative voltage high enough to inject holes to the interface 10 through the p+-type surface separating layer 27.

In more detail, FIG. 4A shows the primary potential distribution in the vertical direction taken across the light shading film 24 from the insulating film 25, the n-type surface optoelectro transducing layer 22, and the p+-type surface layer 23. In the drawing, the surface of the n-type surface optoelectro transducing layer 22 is an inversion layer where electrons are injected, and therefore the electron generation center 56 is not activated in the same way as in the p+-type surface layer shown in FIG. 4B. Therefore, it is possible to reduce the generation of the dark current noise down to a negligible level.

Figure 5:
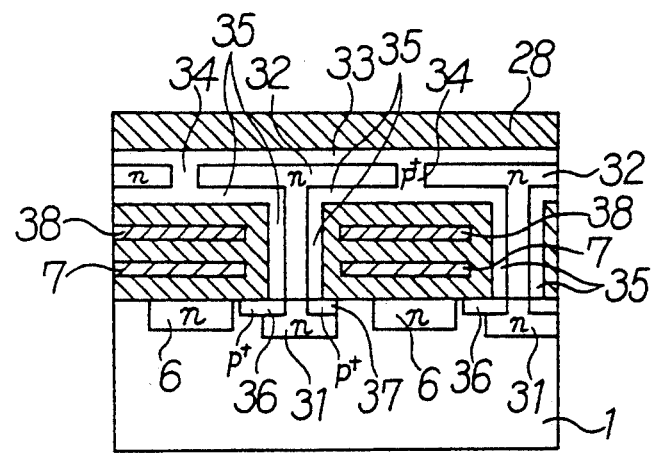
FIG. 5 is a partial cross-sectional view showing a second embodiment of the layer-built solid state image sensing device according to the present invention.
Figure 6:
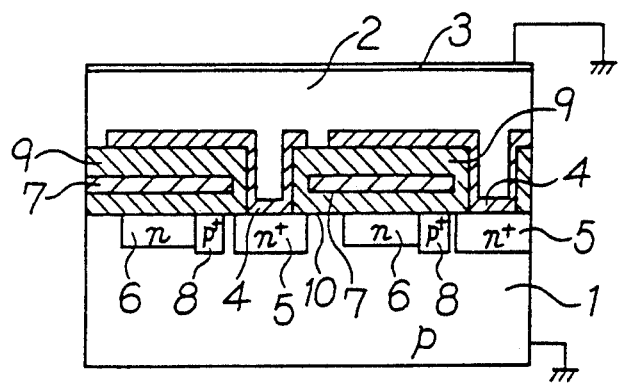
FIG. 6 is a partial constructional cross-sectional view showing a prior art layer-built solid state image sensing device.
Figure 7A:
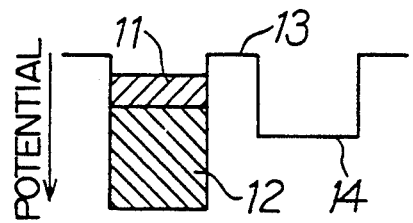
FIGS. 7A and 7B are potential distribution diagrams for assistance in explaining the operation of the prior art layer-built said state image sensing device.
Figure 7B:
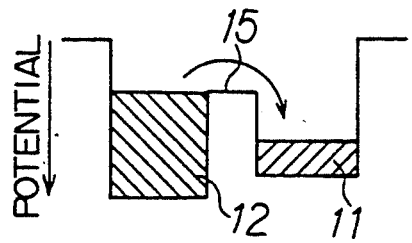

FIG. 5 is a partial cross-sectional view showing a second embodiment of the present invention.

The points different from the first embodiment are that the surface of the n-type surface optoelectro transducing layer 32 and the interface portion between the layer 32 and the insulating film 25 are entirely covered by p+-type high concentration impurity layers 33 and 35, and that the impurity layers 33 and 35 are electrically connected to each other via an element separating p-type impurity layer 34, respectively. Further, in this second embodiment, the interface portions between the surface of the n-type charge storage layer 31 and the insulating film 25 is also covered with the p-type impurity layer 36.

In this embodiment, since all the areas at which signal charges are generated and stored are completely covered with the electrically neutral non-depleted p-type high concentration impurity layers 33 and 35, it is possible to completely prevent the generation of thermal carriers, and therefore to suppress the generation of the dark current. Further, in this embodiment, the light shading film 38 is not necessarily biased by a negative voltage; that is, it is possible to set the potential of the film 33 to the substrate voltage or a floating state.

In the embodiments as described above, the optoelectro transducing elements are directly formed on the semiconductor substrate. Without being limited thereto, however, the transducing elements can be formed within the semiconductor substrate or a semiconductor layer (well) of the opposite conductivity type formed on the semiconductor substrate.

According to the present invention, the second optoelectro transducing layer formed on the insulating layer is connected to the optoelectro transduction storage element separated pixel by pixel, so that the impurity layer of the same conductivity type can be formed; the surface thereof and the isolation portions between the pixels are covered by the impurity layer of the opposite conductivity type; and the potential of the metallic electrode formed within the insulating film is so set that carriers opposite in polarity to the signal charge can be introduced to the interface between the second optoelectro transducing layer and the insulating layer. Therefore, it is possible to transfer the signal charge stored in the optoelectro transduction storage element in a perfect transfer mode, thus eliminating an increase in the dark current and the residual image involved in the prior art layer-built solid state image sensing device.

Further, since the layer-built optoelectro transducing layer (elements) is formed by the same monocrystal semiconductor material, it is possible to easily form pn junctions or inversion boundary layers excellent in crystallization, and therefore to enable an excellent optoelectro transduction, charge storage, and charge transfer, without depletion at the interface portions between the surface of the transducing layer and the insulating layer.

What is claimed is:

1. A layer-built solid state image sensing device, comprising:
   a first semiconductor layer of a first conductivity type;
   a plurality of optoelectro transduction storage elements having a first optoelectro transducing layer of a second conductivity type opposite to the first conductivity type selectively formed within region isolated pixel column by pixel column by a first isolating layer of the first conductivity type formed on a first semiconductor layer surface of the first conductivity type;
   charge transfer elements having a first impurity layer of the second conductivity type formed in columns a regular distance away from optoelectro transduction storage element columns within the isolating areas on the first semiconductor layer surface, a transfer electrode layer buried within an insulating film selectively formed on the surface other than the first optoelectro transducing layer, and a light shielding electrode provided to enclose the transfer electrode also buried within the insulating film, for reading signal charges stored in said optoelectro transducing storage elements;

a second optoelectro transducing layer of the second conductivity type formed on the insulating film and connected to the first optoelectro transducing layer; and a second impurity layer of the first conductivity type for covering the surface of said second optoelectro transducing layer.

2. The layer-built solid state image sensing device of claim 1, wherein said second optoelectro transducing layer is electrically isolated in correspondence with the first optoelectro transducing layer by a second isolating layer, and the second isolating layer is a third impurity layer of the first conductivity type electrically connected to the second impurity layer.

3. The layer-built solid state image sensing device of claim 2, wherein said third impurity layer covers at least a part of side wall and upper surfaces of the insulating film.

4. The layer-built solid state image sensing device of claim 1, wherein said second optoelectro transducing layer is a growth layer of silicon monocrystal.

5. The layer-built solid state image sensing device of claim 1, wherein the light shielding electrode is set to such a potential that a surface inversion layer is formed by storage of the first conductivity type carriers in at least a part of the second optoelectro transducing layer of the second conductivity type brought into contact with the insulating layer.

6. The layer-built solid state image sensing device of claim 1, wherein a depletion potential of the first optoelectro transducing layer is set to such an absolute value higher than that of the second optoelectro transducing layer that impurities of the second conductivity type of the first and second optoelectro transducing layers are both almost perfectly depleted on condition that all signal carriers generated in the first and second optoelectro transducing layers have been transferred to said charge transfer element.

7. The layer-built solid state image sensing device of claim 1, wherein a fourth impurity layer of the first conductivity type is further formed at positions where the first optoelectro transducing layer is in contact with the insulating film.

* * * * *